United States Patent [19]
Kosai et al.

[11] Patent Number: 5,457,331
[45] Date of Patent: Oct. 10, 1995

[54] DUAL-BAND INFRARED RADIATION DETECTOR OPTIMIZED FOR FABRICATION IN COMPOSITIONALLY GRADED HGCDTE

[75] Inventors: Kenneth Kosai; George R. Chapman, both of Goleta, Calif.

[73] Assignee: Santa Barbara Research Center, Goleta, Calif.

[21] Appl. No.: 45,741

[22] Filed: Apr. 8, 1993

[51] Int. Cl.⁶ .................................................. H01L 29/161
[52] U.S. Cl. ......................... 257/188; 257/191; 257/440; 257/442
[58] Field of Search ........................ 257/440, 442, 257/184, 188, 185, 186, 187, 191, 436, 461

[56] References Cited

U.S. PATENT DOCUMENTS

| | | | |
|---|---|---|---|
| 4,582,952 | 4/1986 | McNeely et al. | 257/185 |
| 4,753,684 | 6/1988 | Ondris et al. | 136/258 |
| 4,847,489 | 7/1989 | Dietrich | 250/226 |
| 5,010,381 | 4/1991 | Shiba | 257/440 |
| 5,051,804 | 9/1991 | Morse et al. | 257/185 |
| 5,068,524 | 11/1991 | Elliott et al. | 257/442 |
| 5,113,076 | 5/1992 | Schulte | 250/370.06 |
| 5,149,956 | 9/1992 | Norton | 250/211 J |
| 5,241,196 | 8/1993 | Huang et al. | 257/442 |

FOREIGN PATENT DOCUMENTS

| | | | |
|---|---|---|---|
| 55-101832 | 4/1980 | Japan . | |
| 2255227 | 10/1992 | United Kingdom | 257/184 |

OTHER PUBLICATIONS

Woodall et al., "Differential Phototransducers", *IBM Technical Disclosure Bulletin*, vol. 12, No. 9, Feb. 1970, p. 1486.
"HgCdTe Dual–Band Infrared Photodiodes Grown By Molecular Beam Epitaxy" J. M. Arias et al., J. Appl. Phys. 70 (8), 15 Oct. 1991, pp. 4620–4622.
"Infinite–Melt Vertical Liquid–Phase Epitaxy Of HgCdTe From Hg Solution: Status and Prospects", Journal of Crystal Growth 86 (1988), pp. 161–172.
"Liquid–Phase Epitaxy of $Hg_{1-x}Cd_xTe$ From Hg Solution: A Route To Infrared Detector Structures", T. Tung et al., Mater. Res. Soc. Symp. Proc., vol. 90 (Mater. Res. Soc., Pittsburgh, Pa., 1987) p. 321.
"Some Properties of Photovoltaic $Cd_xHg_{1-x}Te$ Detectors For Infrared Radiation", J. M. Pawlikowski et al., Inst. of Physics Tech. University, Jan. 8, 1975, pp. 331–337.

*Primary Examiner*—Sara W. Crane
*Assistant Examiner*—Courtney A. Bowers
*Attorney, Agent, or Firm*—W. C. Schubert; W. K. Denson-Low

[57] ABSTRACT

A dual-band HgCdTe radiation detector (10) includes a four layer $n-p^+-p-n^+$ structure, grown by LPE, upon a substrate (12). The four layers are, from a bottom layer next to the substrate to the surface: (a) a MWIR radiation responsive n-type absorbing layer (14); (b) a $p^+$ cap layer (16); (c) a LWIR radiation responsive p-type layer (18); and (d) an n+ top layer (20). The $n^+$ top layer has a compositional profile that is similar to the p-type cap layer. Operation of this structure involves biasing the top layer positive with respect to the bottom layer, which results in the collection of LWIR-generated electrons in the p-type layer. Biasing the top layer negative with respect to the bottom layer results in MWIR-generated holes being collected by the bottom n-p+ junction. In this mode, however, the detector structure rejects collection of LWIR-generated electrons because a compositional profile of the two p-type layers prevents the electrons from drifting to the bottom n-p+ junction and being collected.

10 Claims, 5 Drawing Sheets

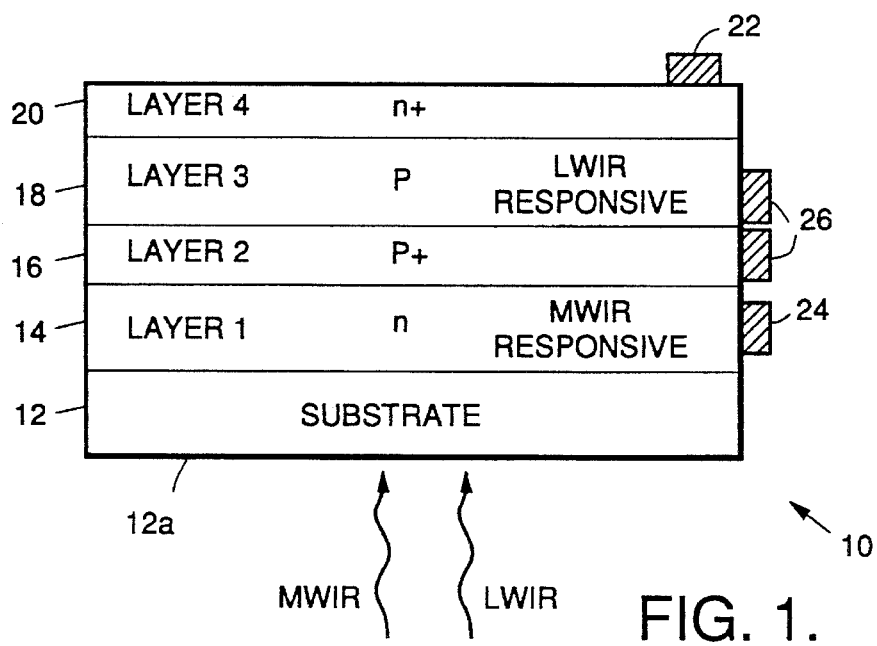
FIG. 1.
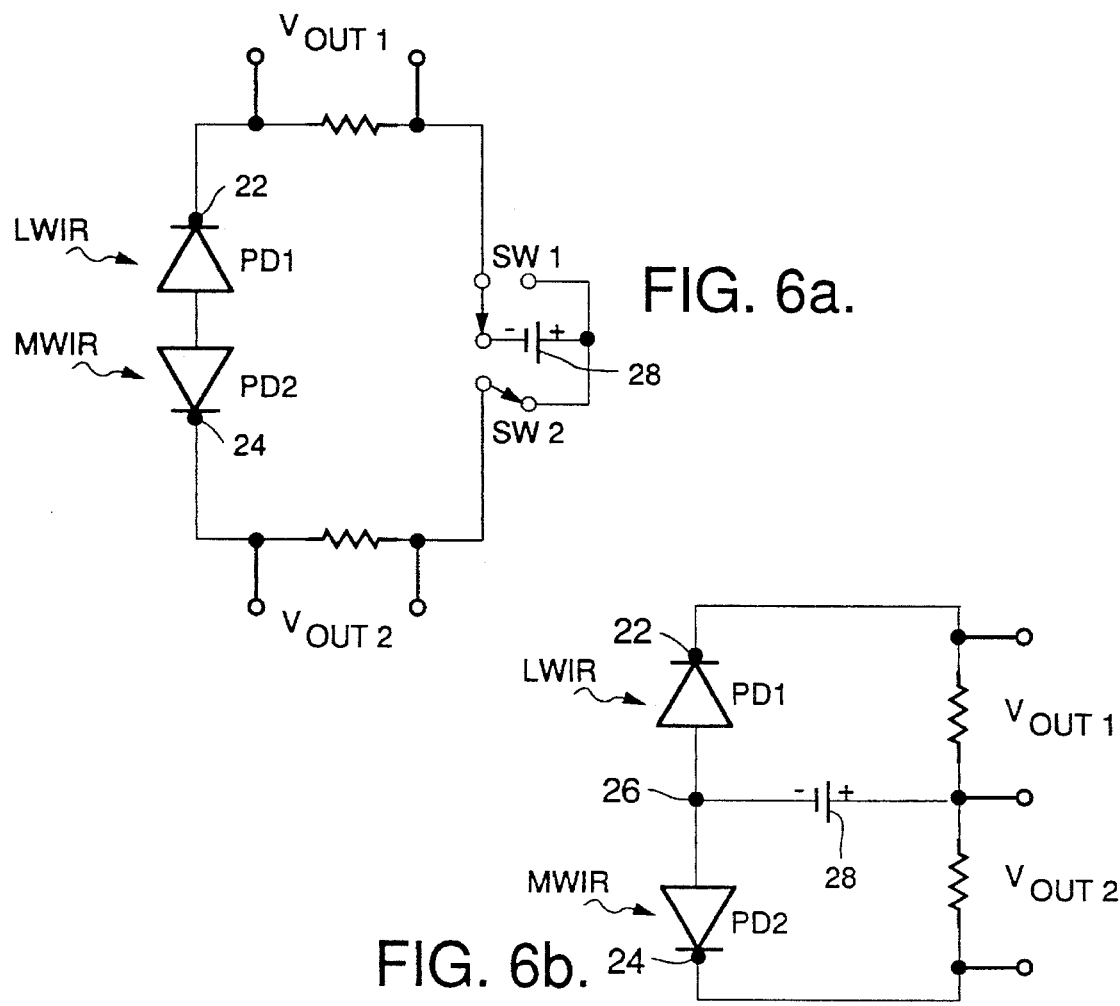
FIG. 6a.
FIG. 6b.

DUAL-BAND INFRARED RADIATION DETECTOR OPTIMIZED FOR FABRICATION IN COMPOSITIONALLY GRADED HGCDTE

FIELD OF THE INVENTION

This invention relates generally to solid state radiation detectors and, in particular, to radiation detectors that are sensitive to radiation within a plurality of spectral bands.

BACKGROUND OF THE INVENTION

Bias-selected n-p$^+$-n mercury-cadmium-telluride (HgCdTe) detectors that are sensitive to infrared (IR) radiation within two spectral bands, or "colors", have been fabricated using various combinations of molecular beam epitaxy (MBE) and liquid phase epitaxy (LPE). These detectors include those fabricated solely by MBE; those fabricated by the MBE growth of a long wavelength IR (LWIR) layer on top of an LPE grown mid-wavelength IR (MWIR) p$^+$-n double layer; and those fabricated using only LPE.

However, a structure grown using MBE typically exhibits a high leakage current and low $R_OA$. This is due to the immaturity of the MBE growth process relative to LPE. Also, a LPE grown structure typically exhibits a poor LWIR quantum efficiency because of an inherent compositional grading that results from LPE growth. An improvement in the LWIR quantum efficiency would require growth at higher temperatures, resulting in increased Hg-Cd interdiffusion. However, this interdiffusion is known to be undesirable because it results in unwanted heterojunction transistor bipolar gain, and the unwanted detection of MWIR radiation when operating in the LWIR radiation detection mode.

Commonly assigned U.S. Pat. No. 5,113,076, "Two Terminal Multi-band Infrared Radiation Detector" to E. F. Schulte, discloses a radiation detector having two heterojunctions that function in a manner analogous to two back-to-back photodiodes. Each of the photodiodes is responsive to radiation within a different IR spectral band, such as LWIR and MWIR. Disclosed configurations include an n-p-n configuration, a p-n-p configuration, and a p-n-p-n configuration.

Reference in this regard is also made to the n-p+-n dual-band detector described by J. M. Arias et al. in the Journal of Applied Physics, 70(8), 15 Oct. 1991, pgs. 4820–4822.

This triple-layer n-p$^+$-n structure assumes that MWIR absorption occurs in the bottom n-type layer, and LWIR absorption in the top n-type layer. However, if this structure were fabricated by the LPE growth of $Hg_{1-x}Cd_xTe$, the physics of the growth process is such that the composition parameter x would decrease as the layer is grown. The result is the generation of an intrinsic electric field that aids in the collection of minority carrier holes in the MWIR responsive layer, but may hinder the collection of holes in the LWIR responsive layer. As a result, LWIR quantum efficiency is reduced.

SUMMARY OF THE INVENTION

It is thus an object of this invention to provide a radiation detector, fabricated by an LPE process, that overcomes the problems set forth above.

It is a further object of this invention to provide a radiation detector that exhibits high LWIR radiation quantum efficiency, that is sensitive to a plurality of spectral bands, and that is fabricated by an LPE process.

The foregoing and other problems are overcome and the objects of the invention are realized by a four layer n-p$^+$-p-n$^+$ structure, grown by LPE, that includes a substrate and, from a bottom layer next to the substrate to the surface: (a) a MWIR radiation responsive low-doped n-type absorbing layer; (b) a high-doped p-type (p$^+$) cap layer; (c) a LWIR radiation responsive low-doped p-type absorbing layer; and (d) a high-doped n-type (n$^+$) top layer. The high-doped n-type top layer has a compositional profile that is similar to the high-doped p-type cap layer.

Operation of this structure involves biasing the top layer positive with respect to the bottom layer, which results in the collection of LWIR-generated electrons in the low-doped p-type layer. This occurs because the top n$^+$-p junction is reverse biased and the bottom p$^+$-n junction is forward biased. Biasing the top layer negative with respect to the bottom layer results in MWIR-generated holes being collected by the bottom n-p$^+$ junction. In this mode, however, the detector structure rejects collection of LWIR-generated electrons because the compositional profile of the two p-type layers prevents the electrons from drifting to the bottom n-p+ junction and being collected.

The detector structure in accordance with this invention thus overcomes the problems of the n-p$^+$-n approach, when implemented using LPE-grown $Hg_{1-x}Cd_xTe$.

The detector structure is also applicable to simultaneous two-color detection, wherein electrical contact is also made to either the p$^+$ cap layer or to the p-type LWIR responsive layer.

In the detector structure according to the invention, the MWIR radiation detector is p$^+$-n and the LWIR radiation detector is n$^+$-p, with the p region being LWIR absorbing. This arrangement differs significantly from the detectors described above in U.S. Pat. No. 5,113,076 and the journal article by Arias et al. That is, the two detectors are stacked with the LWIR active, low-doped p-layer on top of the p$^+$ cap layer of the MWIR detector.

This invention enables the fabrication of two-color detectors using a standard, mature LPE growth process, and furthermore enables the LWIR responsive layer to be grown with a large compositional grading, while still exhibiting good quantum efficiency. By overcoming the restriction that the LWIR layer have low compositional grading; growth can occur at lower temperatures to reduce Hg-Cd interdiffusion and dopant diffusion out of the middle p$^+$ layer. This enables the maintenance of the composition and doping profiles required to suppress heterojunction bipolar transistor gain, and to also reject MWIR response in the LWIR detection mode.

The use of the invention enables the LPE fabrication of two-color detectors with high quantum efficiency (>80 per cent with an antireflective coating) in both wavelength bands of interest. Previously, it has been assumed that vapor phase epitaxy (VPE), such as molecular beam epitaxy (MBE) or metal-organic chemical-vapor deposition (MOCVD), would be required to grow at least the top-most layer. This assumption resulted from the Hg-Cd interdiffusion and the compositional grading that are intrinsic to the LPE growth process. Because VPE is, at present, incapable of producing single-color detectors with performance equal to those produced by LPE, this invention allows production of two-color focal plane arrays (FPAs) of radiation detectors using the mature, well-controlled LPE technology.

BRIEF DESCRIPTION OF THE DRAWINGS

The above set forth and other features of the invention are made more apparent in the ensuing Detailed Description of the Invention, when read in conjunction with the attached Drawings, wherein:

FIG. 1 is a cross-sectional view, not to scale, that illustrates a dual-band IR detector in accordance with this invention;

FIGS. 6a and 6b are each a schematic diagram of the dual-band IR detector of FIG. 1.

DETAILED DESCRIPTION OF THE INVENTION

Figure 2:
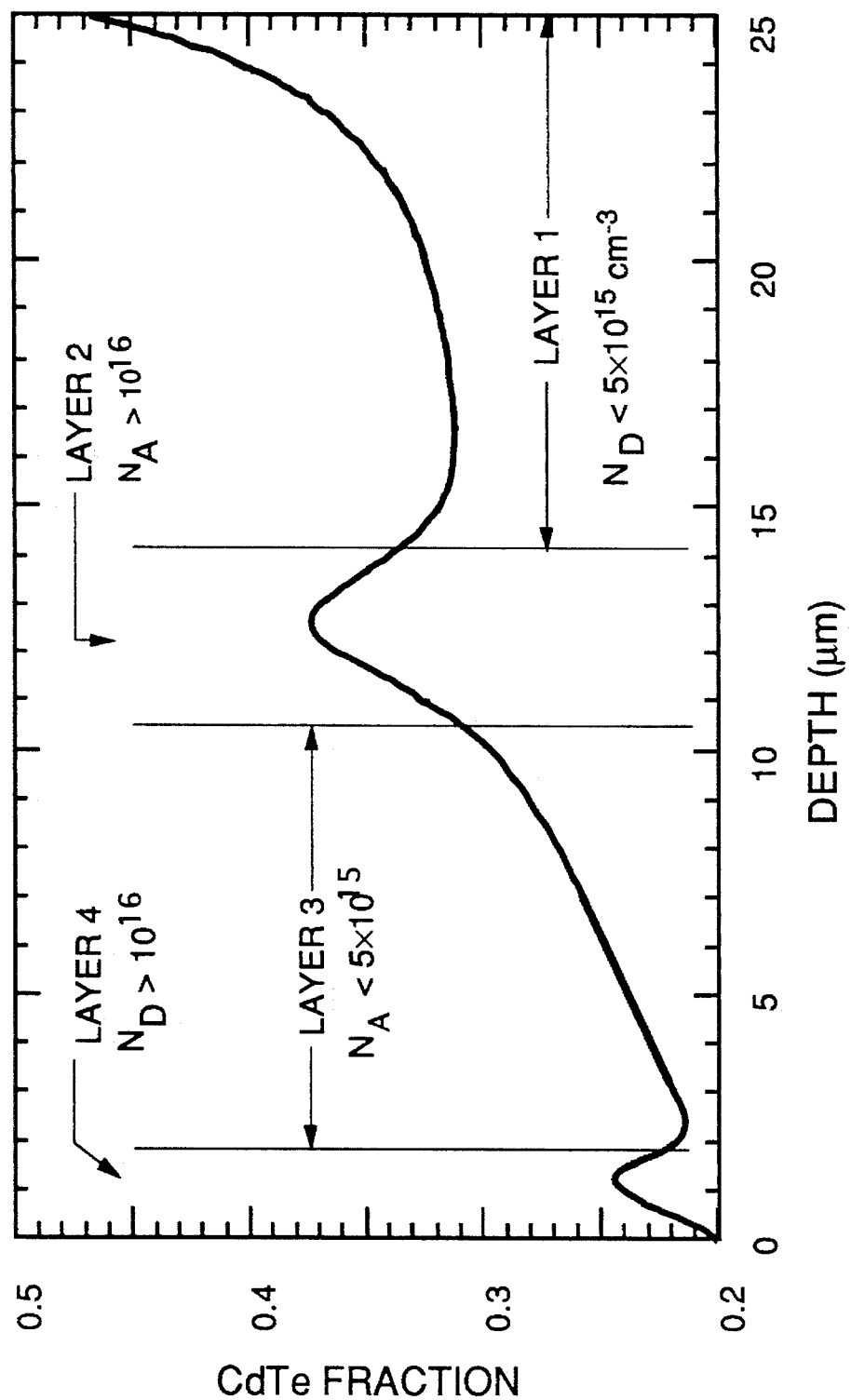
FIG. 2 is a graph that illustrates a compositional profile of the four LPE-grown layers of the detector of FIG. 1.

Reference is first made to FIG. 1 for showing a cross-sectional view, not to scale, of an embodiment of a dual-band radiation detector 10 that is constructed in accordance with this invention. Detector 10 includes a substrate 12 over which is grown, by LPE, a multilayered HgCdTe detector structure.

Presently preferred LPE growth techniques are described in, by example, the following two articles: T. Tung, M. H. Kalisher, A. P. Stevens and P. E. Herning, in: Materials for Infrared Detectors and Sources, Mater. Res. Soc. Symp. Proc., Vol. 90 (Mater. Res. Soc., Pittsburg, Pa., 1987), p. 321; and T. Tung, Infinite-Melt Vertical Liquid-Phase Epitaxy of HgCdTe from Hg Solution: Status and Prospects, J. Crystal Growth 86 (1988), pgs. 161–172.

The LPE-grown multilayered HgCdTe detector structure is comprised of a first layer 14 (Layer 1) which is an n-type MWIR responsive radiation absorbing layer. Layer 1 has a thickness of approximately 11 micrometers and is doped n-type with, by example, indium. Overlying the first layer 14 is a second layer 16 (Layer 2) which is a p+-type cap layer. Layer 2 has a thickness of approximately 3.5 micrometers and is doped p-type with, by example, arsenic. Overlying the second layer 16 is a third layer 18 (Layer 3) which is a p-type LWIR responsive radiation absorbing layer. Layer 3 has a thickness of approximately 8.5 micrometers and is doped p-type with, by example, arsenic. Overlying the third layer 18 is a top layer 20 (Layer 4) which is an n+-type layer. Layer 4 has a thickness of approximately 1.8 micrometers and is doped n-type with, by example, indium. A first electrical contact 22 is electrically coupled to the fourth layer 20, a second electrical contact 24 is electrically coupled to the first layer 14, and an optional third electrical contact 26 is electrically coupled to either the second layer 16 or the third layer 18.

FIGS. 6a and 6b are each a schematic diagram that illustrate the n-p+-p-n+ detector 10 of FIG. 1. More specifically, FIG. 6a shows the use of the contacts 22 and 24 that are coupled via switches SW1 and SW2 to a source of bias potential, illustrated as a battery 28. When SW1 is coupling the anode of the LWIR photodiode (PD1) to the negative terminal of battery 28, SW2 is coupling the anode of PD2 to the positive terminal of battery 28. This forward biases PD1 and reverse biases PD2, selecting the MWIR detection operating mode. The opposite biasing arrangement, selecting the LWIR detection operating mode, occurs when SW1 couples PD1 to the positive terminal of battery 28 and SW2 couples PD2 to the negative terminal. FIG. 6b illustrates the use of the contact 26 which enables the simultaneous reverse biasing of both PD1 and PD2, and the readout of photocurrent generated in response to MWIR and/or LWIR radiation.

Referring again to FIG. 1, IR radiation is incident upon a bottom surface of the substrate 12. Substrate 12 is thus comprised of a material, such as CdZnTe, that is substantially transparent to IR radiation having wavelengths of interest, or MWIR and LWIR in this case. An antireflection coating 12a may be applied to the bottom surface of the substrate 12 to improve efficiency.

As employed herein Short Wavelength Infrared (SWIR) radiation is considered to include a spectral region extending from approximately 1000 nanometers (nm) to approximately 3000 nm. Medium Wavelength Infrared (MWIR) radiation is considered to include a spectral region extending from approximately 3000 nm to approximately 8000 nm. Long Wavelength Infrared (LWIR) radiation is considered to include a spectral region extending from approximately 7000 nm to approximately 14000 nm. Very Long Wavelength Infrared (VLWIR) radiation is considered to include a spectral region extending from approximately 12000 nm to approximately 30000 nm. Although the bands overlap to some extent, for the purposes disclosed herein the overlap is not considered to be significant. Also, as employed herein a semiconductor material is considered to exhibit significant responsivity to a given spectral band if the semiconductor material exhibits a maximum or substantially maximum photosensitivity to wavelengths within the given spectral band.

FIG. 2 illustrates a compositional profile as a function of depth in micrometers, and also the acceptor ($N_A$) and donor ($N_D$) doping concentrations, for the detector 10 of FIG. 1. As can be seen, the compositional profile is varied through the detector 10 in a controlled manner to provide a gradual reduction in bandgap energy from the Layer 1 to the Layer 4, and to also provide relatively higher bandgap energies within the Layers 2 and 4. The $n^+$ Layer 4 has a compositional profile that is similar to the $p^+$ Layer 2. The variation in bandgap energies is specifically shown in FIG. 3.

Layers 1 and 2 form a $p^+$-n MWIR-responsive photodiode (PD2 of FIGS. 6a and 6b). On top of these two layers, the low doped (acceptor concentration of $<5 \times 10^{15}$ cm$^{-3}$), p-type Layer 3 is grown by LPE, followed by the highly doped (donor concentration $>10^{16}$ cm$^{-3}$) n+ Layer 4. Layers 3 and 4, also grown by LPE, form a $n^+$-p LWIR-responsive photodiode (PD1 of FIGS. 6a and 6b).

To form a bias-switchable two-color detector of a type disclosed by E. Schulte in U.S. Pat. No. 5,113,076, contact is made to the n-type Layers 1 and 4, via contacts 22 and 24 as described above, and LWIR-sensitive operation is selected by biasing the Layer 4 positive with respect to the Layer 1, while MWIR-sensitive operation is obtained by biasing the Layer 4 negative with respect to Layer 1. A simultaneous two-color device is achieved by also making contact to one of the middle p-type Layers 2 or 3 with the contact 26. One advantage of the technique provided by the invention is that the Layers 2 and 3 are made relatively thick, which makes control of etch depth less critical when fabricating the contact 26. That is, it should be realized that the contact 26 would not normally be applied as shown in FIG. 1, but would instead be applied by first etching an opening at least through the Layer 4, and also possibly the Layer 3, in order to form an electrical contact to either the Layer 2 or the Layer 3.

Figure 3:
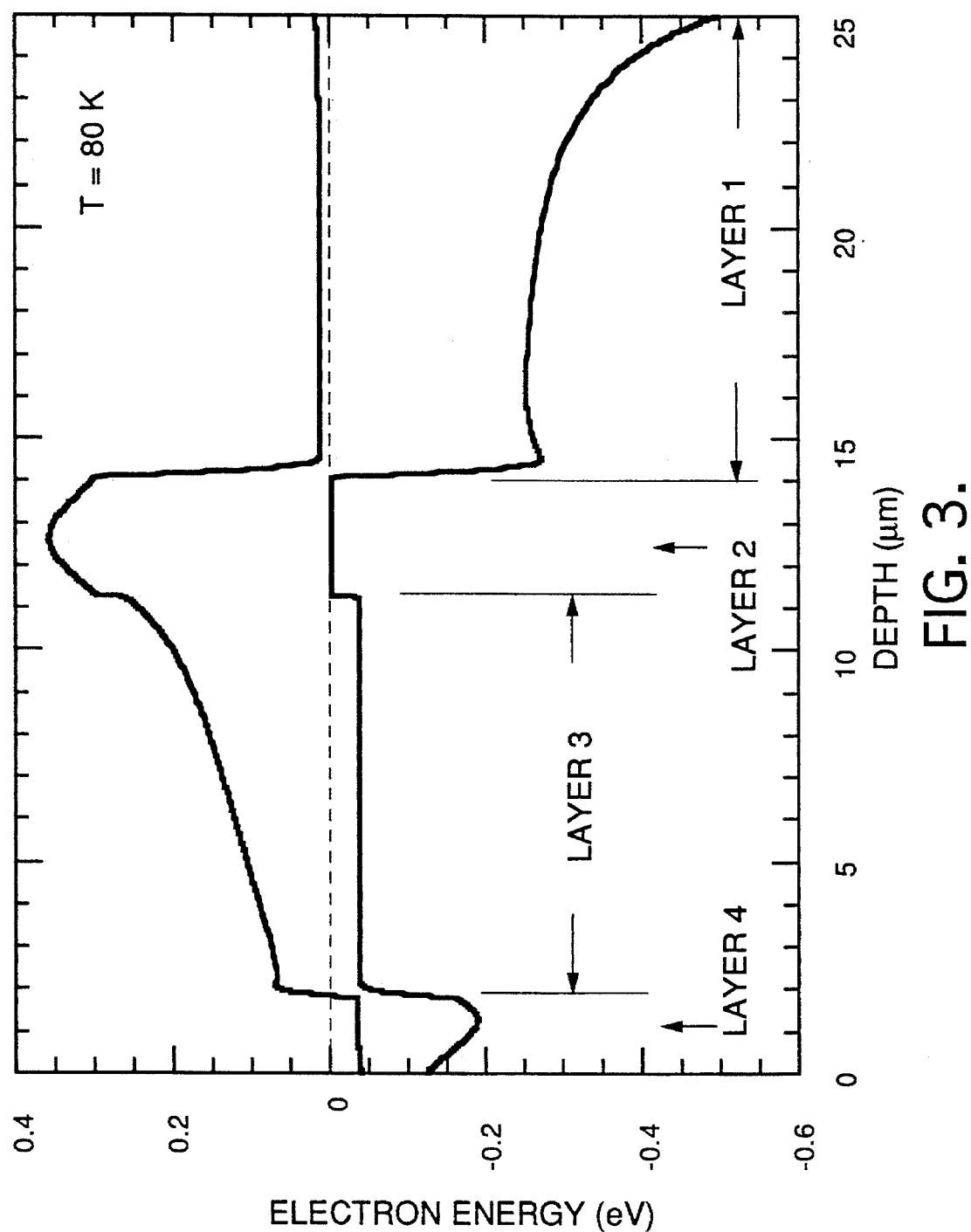
FIG. 3 is a graph that illustrates an energy band diagram for the compositional profile shown in FIG. 2.

FIG. 3 is a calculated energy band diagram that results from the compositional grading illustrated in FIG. 2. When negatively biased for MWIR operation, minority carrier holes are created in Layer 1, and drift and diffuse to the reverse-biased $p^+$-n junction formed between Layers 1 and 2. LWIR radiation is absorbed in the p-type Layer 3. This LWIR radiation is not sensed, however, because the minority carrier electrons are drifted by the electric field, that results from the compositional grading, to the $n^+$-p junction formed with Layer 4.

In the LWIR-sensitive mode the quantum efficiency for detection of LWIR photons is high, because the collection of minority carrier electrons by the $n^+$-p junction between Layers 3 and 4 is enhanced by the band gap energy variation that results from the compositional grading. MWIR radiation is not sensed in this case because the lower $p^+$-n junction between Layers 1 and 2 is forward biased.

Figure 4:
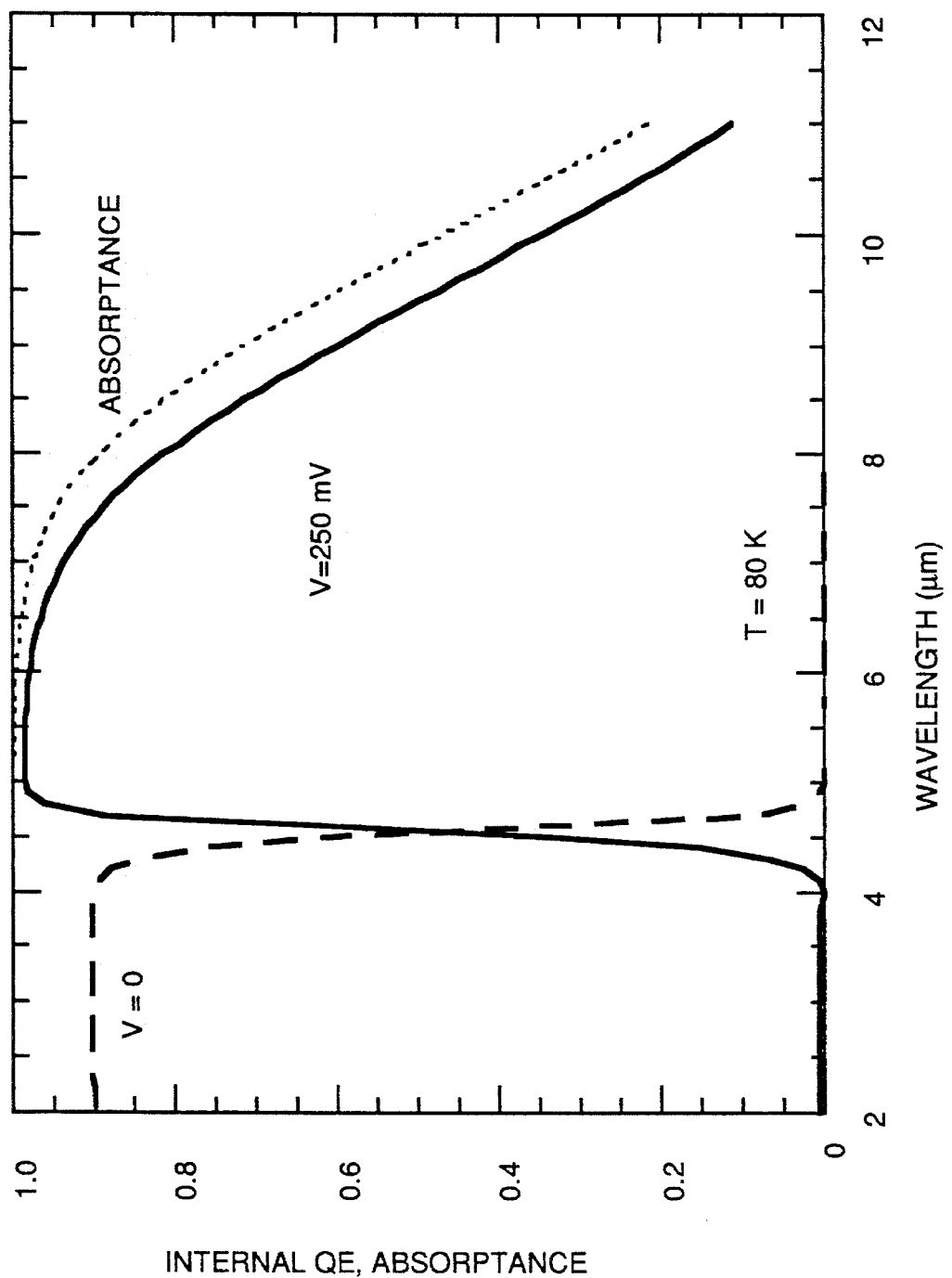
FIG. 4 is a graph depicting a modeled spectral response for the detector illustrated in FIG. 1, the graph illustrating a MWIR (V=0) and a LWIR (V=250 mV) mode, compared with absorptance.

FIG. 4 shows a calculated spectral response of the detector 10 when biased for MWIR (V=0) and LWIR (V=250 mV) operation. The high collection of minority carrier electrons in the LWIR mode is seen by comparing the quantum efficiency (QE) with the absorptance.

Figure 5:
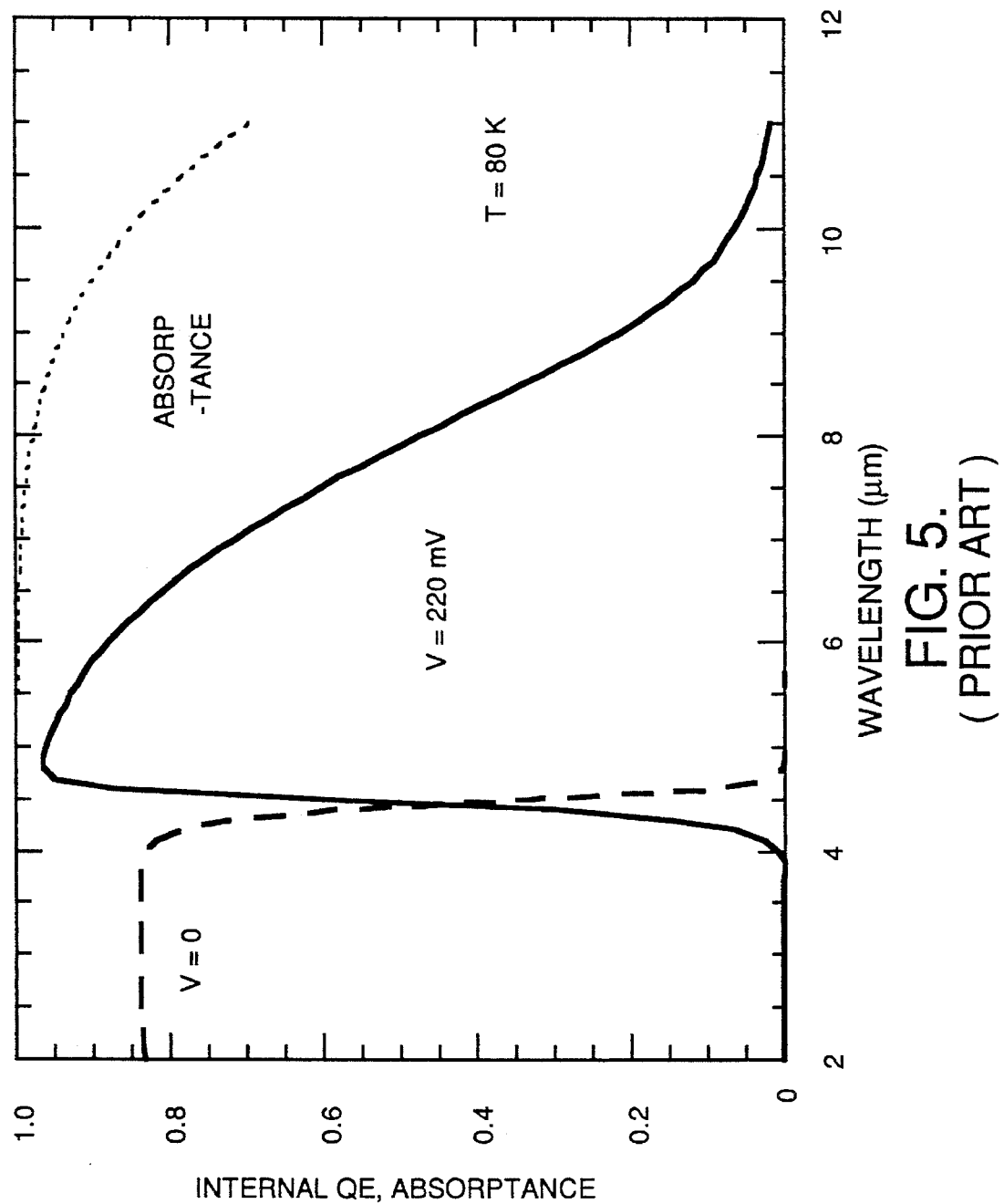
FIG. 5 is a graph illustrating a modeled spectral response for a n-p+-n detector structure of the prior art, showing a reduced LWIR quantum efficiency (V=220 mV) compared with absorptance.

By comparison, FIG. 5 illustrates a calculated spectral response for a conventional n-$p^+$-n device of a type described by Arias et al., but with compositional grading resulting from state-of-the-art LPE growth. The detrimental effect of the compositional grading in the LWIR-absorbing layer is demonstrated by the rapid decrease at longer wavelengths in the quantum efficiency curve (V=220 mV), compared with the absorptance.

In accordance with a method of this invention, there is provided a process for fabricating a radiation detector structure, comprising the steps of providing a substrate; and growing a first region comprised of Group II–VI semiconductor material upon a first surface of the substrate. The first region is doped to provide a first type of electrical conductivity and has a bandgap selected for absorbing radiation within a first spectral band. The process then grows a second region upon the first region, the second region being comprised of Group II–VI semiconductor material that is doped to provide a second type of electrical conductivity that is opposite the first type of electrical conductivity. A next step grows a third region upon the second region, the third region being comprised of Group II–VI semiconductor material that is doped to provide the second type of electrical conductivity. The third region has a bandgap selected for absorbing radiation within a second spectral band. A next step grows a fourth region upon the third region, the fourth region being comprised of Group II–VI semiconductor material that is doped to provide the first type of electrical conductivity.

In accordance with an aspect of this invention, the steps of growing a first, second, third and fourth region are all accomplished by Liquid Phase Epitaxy. Furthermore, for a case where the Group II–VI semiconductor material is comprised of $Hg_{1-x}Cd_xTe$, during the execution of the steps of growing x is varied so as to provide a decreasing bandgap energy within the first region, to provide an increasing bandgap energy within the second region, to provide a decreasing bandgap energy with the third region, and to provide an increasing bandgap energy within the fourth region.

Although described in the context of a MWIR-LWIR radiation responsive device, it should be realized that the detector 10 can be constructed to be responsive to other combinations of wavelength bands, such as SWIR-MWIR, SWIR-LWIR, or MWIR-VLWIR. The arrangement of the radiation absorbing layers in these alternate embodiments is such that the incident radiation first encounters the wider bandgap semiconductor material. Furthermore, in these alternate embodiments the material of the substrate 12 is selected so as to be substantially transparent to the wavelength bands of interest. Also, the substrate 12 can be comprised of a material other than a Group II–VI material (CdZnTe). For example, the substrate 12 can be comprised of a Group IV material, such as Si, or a Group III–V material, such as GaAs.

Thus, while the invention has been particularly shown and described with respect to a preferred embodiment thereof, it will be understood by those skilled in the art that changes in form and details may be made therein without departing from the scope and spirit of the invention.

What is claimed is:

1. A radiation detector structure responsive to electromagnetic radiation within two spectral bands, said radiation detector structure including a plurality of adjacently disposed layers of Group II–VI semiconductor material and comprising:

a first layer comprised of Group II–VI semiconductor material, said first layer being doped to provide a first type of electrical conductivity and having a bandgap selected for absorbing radiation within a first spectral band;

a second layer overlying said first layer, said second layer being comprised of Group II–VI semiconductor material, said second layer being doped to provide a second type of electrical conductivity that is opposite the first type of electrical conductivity said first and second layers forming a first junction;

a third layer overlying said second layer, said third layer being comprised of Group II–VI semiconductor material, said third layer being doped to provide the second type of electrical conductivity and having a bandgap selected for absorbing radiation within a second spectral band; and a fourth layer overlying said third layer, said fourth layer being comprised of Group II–VI semiconductor material, said fourth layer being doped to provide the first type of electrical conductivity said third and fourth layers forming a second junction wherein said Group II–VI semiconductor material is comprised of $Hg_{1-x}Cd_xTe$ wherein x is varied through the thickness of the first layer in a direction toward the second layer so as to provide a decreasing bandgap energy within said first layer in the direction toward said second layer, and wherein x is varied through the thickness of the third layer in a direction toward the fourth layer so as to provide a decreasing bandgap energy within said third layer in the direction toward said fourth layer.

2. A radiation detector structure as set forth in claim 1, and further comprising:

a first electrical contact that is electrically coupled to said first layer; and a second electrical contact that is electrically coupled to said fourth layer.

3. A radiation detector structure as set forth in claim 2, and further comprising a third electrical contact that is electrically coupled to one of said third layer and said second layer.

4. A radiation detector structure as set forth in claim 1, wherein said first and second spectral bands are selected from the group consisting of SWIR, MWIR, LWIR and VLWIR.

5. A radiation detector structure as set forth in claim 1, wherein x is varied through the thickness of the second layer in a direction away from said first layer so as to provide an increasing bandgap energy within said second layer in the direction away from said first layer and wherein x is varied through the thickness of the fourth layer in a direction away from said third layer so as to provide an increasing bandgap energy within said fourth layer in the direction away from said third layer.

6. A radiation detector structure as set forth in claim 1, wherein said first layer is doped n-type, wherein said second layer is doped $p^+$-type, wherein said third layer is doped p-type, and wherein said fourth layer is doped $n^+$-type.

7. A radiation detector structure as set forth in claim 1, and further comprising a substrate having a first surface adjacent to a surface of said first layer, said substrate being selected from a material that is substantially transparent to electromagnetic radiation within said first and said second spectral bands.

8. A radiation detector structure as set forth in claim 7, and further comprising an antireflection coating that is disposed upon a second surface of said substrate, said second surface being opposite said first surface, said second surface being a radiation admitting surface of said radiation detector structure.

9. A radiation detector structure as in claim 2 further comprising a source of bias potential connected between said first and second electrical contacts capable of being switched to alternately reverse bias said first junction and said second junction.

10. A radiation detector structure as in claim 3 further comprising a source of bias potential connected to said third electrical contact on one side of said source and coupled to said first and second electrical contacts on a second side of said source to reverse bias said first and second junctions.

* * * * *